United States Patent
Edwards et al.

(10) Patent No.: US 10,446,436 B2
(45) Date of Patent: Oct. 15, 2019

(54) IN-LINE PROTECTION FROM PROCESS INDUCED DIELECTRIC DAMAGE

(71) Applicant: NXP USA, INC., Austin, TX (US)

(72) Inventors: William Ernest Edwards, Dexter, MI (US); Brian George Anthony, Austin, TX (US)

(73) Assignee: NXP USA, INC., Austin, TX (US)

( * ) Notice: Subject to any disclaimer, the term of this patent is extended or adjusted under 35 U.S.C. 154(b) by 46 days.

(21) Appl. No.: 15/715,312

(22) Filed: Sep. 26, 2017

(65) Prior Publication Data
US 2019/0096749 A1    Mar. 28, 2019

(51) Int. Cl.
*H01L 21/768* (2006.01)

(52) U.S. Cl.
CPC .. *H01L 21/76807* (2013.01); *H01L 21/76816* (2013.01); *H01L 21/76829* (2013.01); *H01L 21/76877* (2013.01); *H01L 2221/1031* (2013.01)

(58) Field of Classification Search
CPC ......... H01L 21/76807; H01L 21/76829; H01L 21/76877; H01L 21/76816; H01L 2221/1031; H01L 21/4853; H01L 23/62
See application file for complete search history.

(56) References Cited

U.S. PATENT DOCUMENTS

| | | | |
|---|---|---|---|
| 4,753,896 A * | 6/1988 | Matloubian | H01L 21/76224 257/350 |
| 5,532,174 A | 7/1996 | Corrigan | |
| 5,798,281 A | 8/1998 | Smayling | |
| 5,843,835 A | 12/1998 | Liu | |
| 5,899,703 A | 5/1999 | Kalter et al. | |
| 6,069,017 A | 5/2000 | Kamieniecki et al. | |
| 6,291,281 B1 | 9/2001 | Wang et al. | |
| 6,323,076 B1 | 11/2001 | Wilford | |
| 6,372,614 B2 | 4/2002 | Rangarajan et al. | |
| 6,433,403 B1 | 8/2002 | Wilford | |
| 6,518,165 B1 | 2/2003 | Yoon et al. | |
| 6,537,883 B2 | 3/2003 | Chen et al. | |
| 7,974,055 B2 | 7/2011 | Lin | |
| 8,436,430 B2 * | 5/2013 | Yu | H01L 29/861 257/409 |
| 9,322,870 B2 | 4/2016 | Edwards et al. | |
| 2008/0002317 A1 | 1/2008 | Lin | |
| 2017/0092584 A1 | 3/2017 | Sheng et al. | |

FOREIGN PATENT DOCUMENTS

JP        2006140184 A    6/2006

* cited by examiner

*Primary Examiner* — Latanya N Crawford

(57) ABSTRACT

A method of protecting a dielectric during fabrication is provided. A conductive layer is patterned to form a first conductive shape on a first portion of a dielectric layer and a second conductive shape on a second portion of the dielectric layer. A conductive trace is formed over at least a portion of the second conductive shape. The conductive trace electrically connects the first conductive shape with a substrate tie. An interconnect layer is coupled to the first conductive shape. The conductive trace is etched to electrically isolate the first conductive shape from the substrate tie.

25 Claims, 8 Drawing Sheets

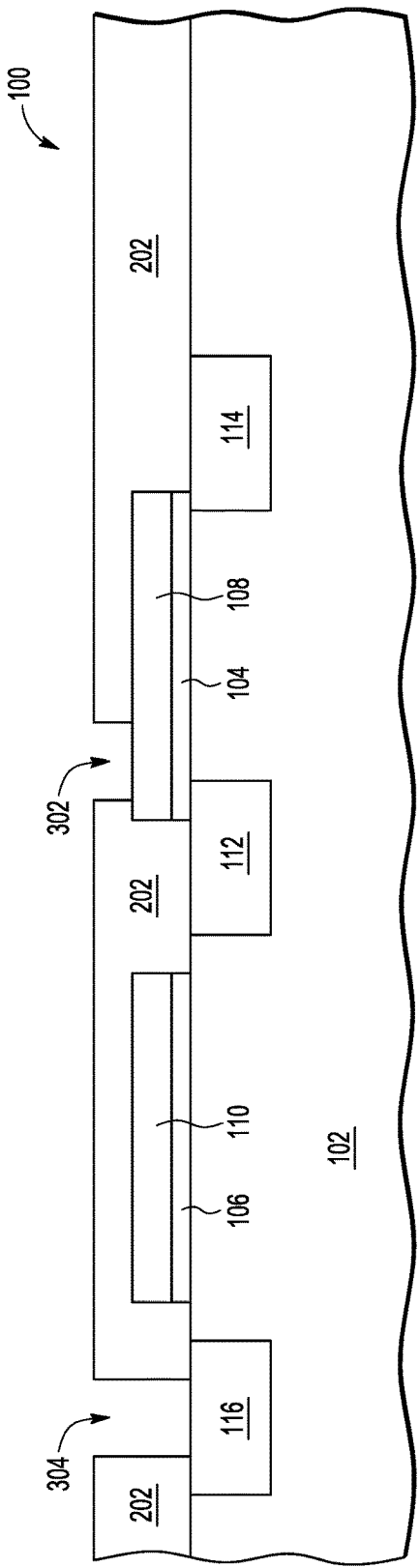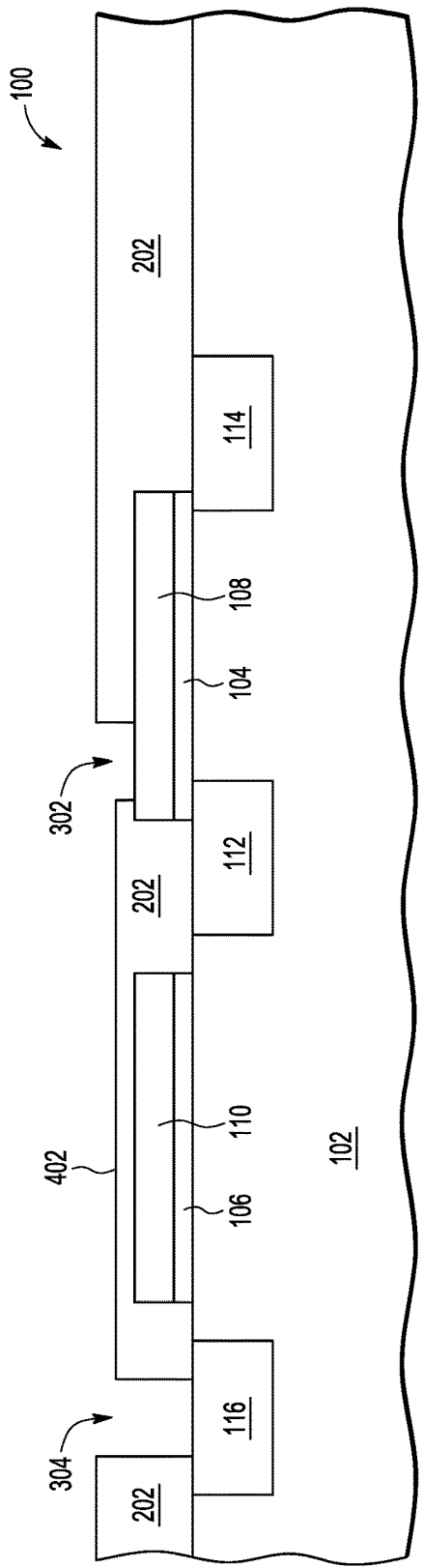

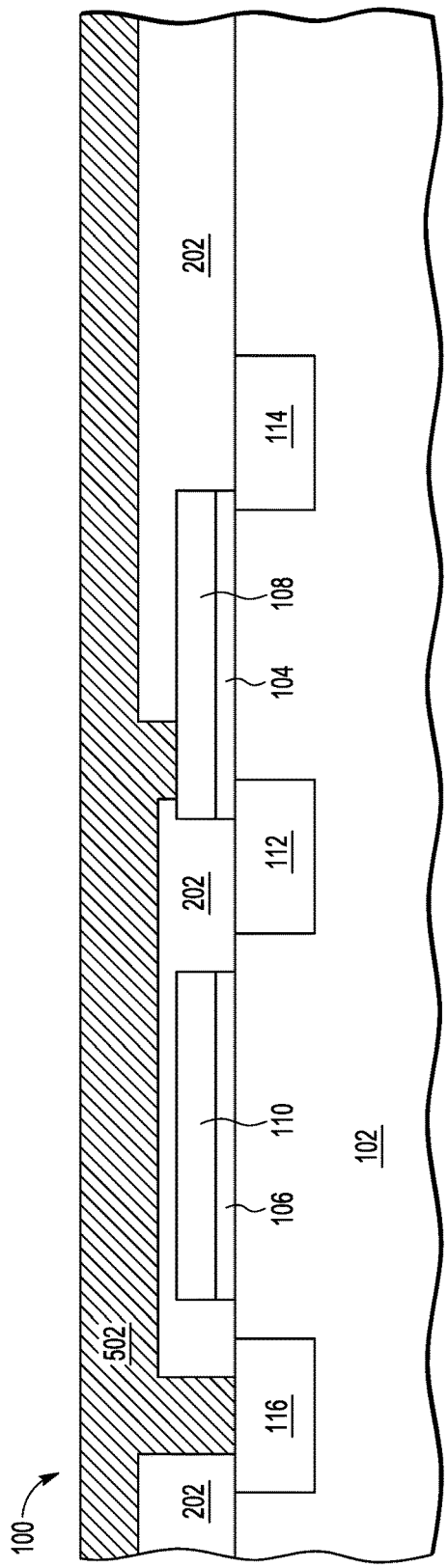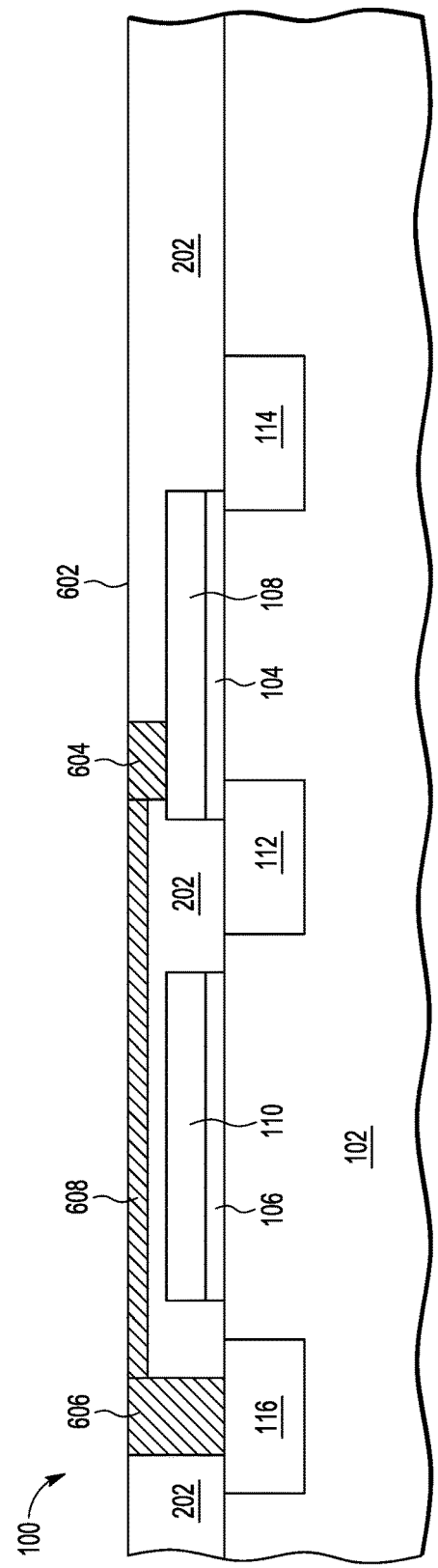

IN-LINE PROTECTION FROM PROCESS INDUCED DIELECTRIC DAMAGE

BACKGROUND

Field

This disclosure relates generally to semiconductor device manufacture, and more specifically, to in-line protection from process induced dielectric damage.

Related Art

Traditional semiconductor devices and semiconductor device fabrication processes are well known. For example, metal oxide semiconductor field-effect transistors (MOSFETs) are commonly used in a variety of different applications and electronic products—from sewing machines to washing machines, from automobiles to cellular telephones, and so on. As process technology progresses, these semiconductor devices are expected to reduce in size and cost while increasing performance. However, some semiconductor devices may be damaged during fabrication. Challenges exist today in addressing damage to semiconductor devices which may be caused by fabrication processes.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 through FIG. 10 illustrate, in simplified cross-sectional views, various stages of manufacture of an exemplary in-line protection structure in accordance with an embodiment of the present invention.

DETAILED DESCRIPTION

Dielectrics in an integrated circuit such as gate oxides, capacitors, and dielectric isolation, are susceptible to damage during manufacturing processes. Wet chemical processing can create large static charges. Plasma etching of metals and vias also creates large electrical charges. If no discharge path exists, these charges accumulate and create a voltage potential across such dielectrics. If the voltage potential is sufficiently large, the integrity of the dielectric can be degraded or permanently damaged. To protect dielectrics from damage, permanent (e.g. antenna diode) or temporarily connected circuit elements can be added to create a discharge path.

Generally, there is provided, an integrated circuit (IC) in-line protection structure and method of forming the same. The in-line protection structure prevents excessive charge build up on device features (e.g., transistor gates, capacitor plates, deep trench dielectric isolation) which may cause oxide damage during manufacture of the IC. A conduction path from such device feature to the substrate of the IC is formed from a same metallization (e.g., tungsten) step. For example, a first contact of the conduction path is connected to a transistor gate and a second contact of the conduction path is connected to the substrate by way of substrate tie. A portion of the conduction path is formed over a dummy structure used as an etch stop, where the dummy structure and transistor gate are formed during a same process step and with same materials (e.g., polysilicon). After other interconnections to circuit features on the IC are coupled to the transistor gate during subsequent stages of manufacture, the conduction path can be opened by way of an etch process.

FIG. 1 through FIG. 10 illustrate, in simplified cross-sectional views, various stages of manufacture of an exemplary in-line protection structure 100 in accordance with an embodiment of the present invention.

Figure 1:
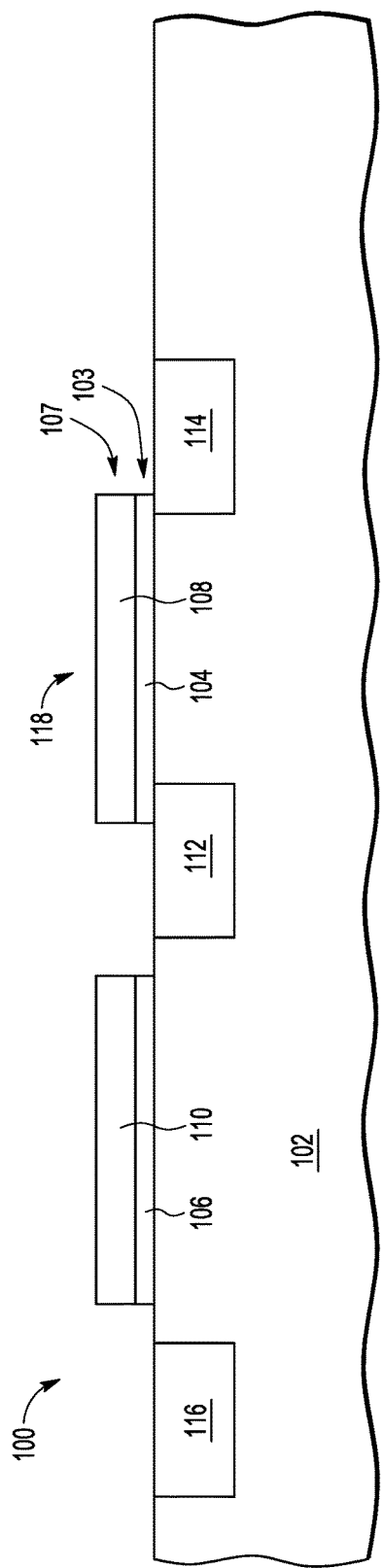

FIG. 1 illustrates in a simplified cross-sectional view, in-line protection structure 100 at a stage of manufacture in accordance with an embodiment of the present invention. At this stage, in-line protection structure 100 includes a semiconductor substrate 102, a dielectric layer 103 formed on substrate 102, and a conductive layer 107 formed on the dielectric layer 103.

Substrate 102 may be formed from suitable silicon-based substrate materials such as gallium arsenide, silicon germanium, silicon-on-insulator (SOI), silicon, monocrystalline silicon, the like, and combinations thereof, for example. Dielectric layer 103 may be formed by growing an oxide dielectric material to a predetermined thickness, for example. Other suitable dielectric materials and techniques may be used to form dielectric layer 103 such as high-K or low-K dielectric materials, for example. After forming dielectric layer 103, a conductive material is deposited on the dielectric layer 103 to form conductive layer 107. The conductive layer 107 is patterned and etched to form gate 108 and etch stop 110 regions or shapes. Gate 108 and etch stop 110 regions or shapes are separate from one another. In this embodiment, a self-aligned process is used to form corresponding gate oxide 104 and etch stop oxide 106 portions of dielectric layer 103.

In this embodiment, conductive layer 107 is formed from a polysilicon material and patterned to form a polysilicon gate 108 on a first portion 104 of a gate dielectric layer 103 and a polysilicon etch stop 110 on a second portion 106 of the gate dielectric layer. As understood by those skilled in the art, conductive layer 107 may be formed from other suitable conductive materials such as tantalum, tantalum nitride, tungsten, tungsten nitride, the like and combinations thereof, for example.

After gate 108 and etch stop 110 shapes are formed, source/drain regions 112 and 114, and tie region 116 are implanted. Source/drain regions 112 and 114 are formed as an opposite species type as substrate 102. In contrast, substrate tie region is formed as a similar species type as substrate 102. In this embodiment, substrate 102 may be characterized as a body region or well region for a transistor 118 formed by gate 108, gate oxide 104, and source/drain regions 112 and 114. For example, when transistor 118 is formed as an N-channel transistor, source/drain regions 112 and 114 would be formed as (N-type species) N+(plus) regions in substrate or body region 102 formed as a (P-type species) P− (minus) region. In this embodiment, substrate tie 116 may be characterized as a body tie or well tie. In this example, substrate tie 116 would be formed as a (P-type species) P+(plus) region. transistor 118 may be formed as a P-type transistor in an N-type substrate. In some embodiments, transistor 118 may be characterized as a metal gate transistor. In some embodiments, transistor 118 may be formed as a P-type transistor in an N-type substrate.

As understood by those skilled in the art, other transistor types and other device types may be formed having a dielectric like gate oxide 104 protected by in-line protection structure 100. For example, capacitor dielectric, metal-gate transistor dielectric, deep trench dielectric isolation, and the like. In some embodiments, transistor 118 may be characterized as a metal gate transistor. A capacitor may be formed with gate oxide 104 where gate 108 is characterized as a plate of the capacitor.

Figure 2:
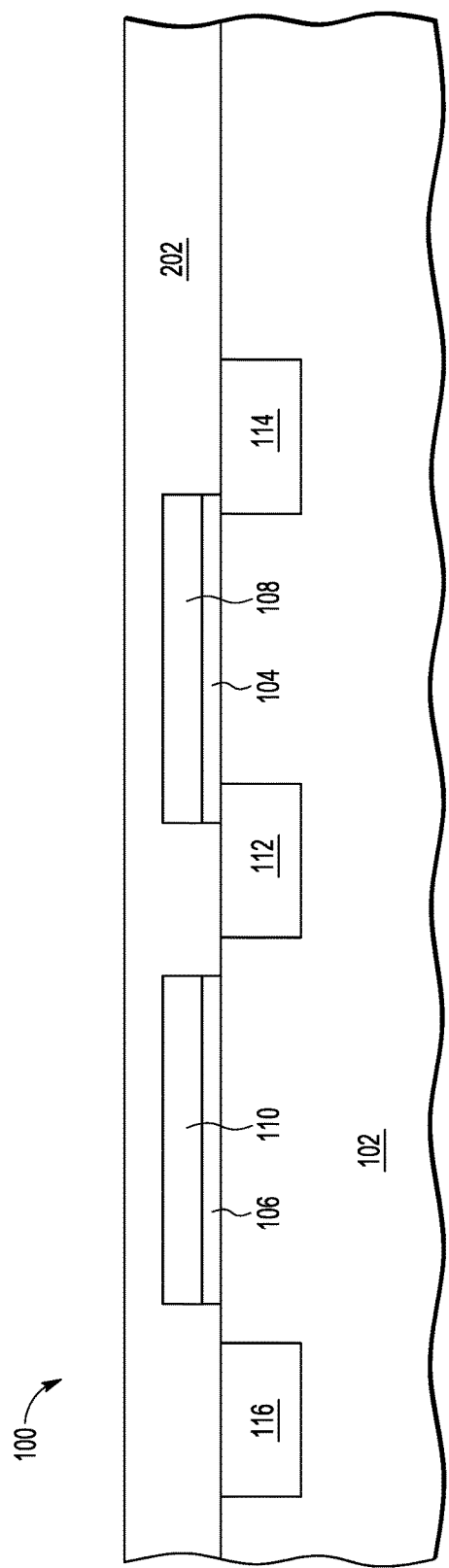

FIG. 2 illustrates in a simplified cross-sectional view, in-line protection structure 100 at a subsequent stage of manufacture in accordance with an embodiment of the present invention. At this stage, a blanket interlevel dielectric (ILD) layer 202 is deposited over gate 108 and etch stop 110 and other exposed surfaces such as source/drain regions 112 and 114, and substrate tie 116, for example. In this embodiment, interlevel dielectric layer 202 is formed from a deposited oxide such as tetraethyl orthosilicate (TEOS). Other suitable materials and techniques may be used to form interlevel dielectric layer 202.

FIG. 3 illustrates in a simplified cross-sectional view, in-line protection structure 100 at a subsequent stage of manufacture in accordance with an embodiment of the present invention. At this stage, contact openings 302 and 304 are formed in the interlevel dielectric layer 202. Contact opening 302 is formed to expose at least a portion of gate 108 and contact opening 304 is formed to expose at least a portion of substrate tie 116. The interlevel dielectric layer 202 may be etched by way of wet or dry etch processes or combinations thereof to form contact openings 302 and 304.

FIG. 4 illustrates in a simplified cross-sectional view, in-line protection structure 100 at a subsequent stage of manufacture in accordance with an embodiment of the present invention. At this stage, a recessed channel 402 is formed between contact openings 302 and 304. After forming contact openings 302 and 304, the portion of ILD layer 202 between contact openings 302 and 304 is etched to form recessed channel 402 between contact openings 302 and 304. The portion of ILD layer 202 between contact openings 302 and 304 may be etched by way of wet or dry etch processes or combinations thereof to form recessed channel 402.

FIG. 5 illustrates in a simplified cross-sectional view, in-line protection structure 100 at a subsequent stage of manufacture in accordance with an embodiment of the present invention. At this stage, a blanket conductive layer (e.g., tungsten) 502 is deposited to fill contact openings and recessed channel 402. After forming contact openings 302 and 304 and recessed channel 402, conductive layer 502 is deposited to fill contact openings 302 and 304 and recessed channel 402. In this embodiment, tungsten fluoride is used for depositing tungsten layer (502) in a chemical vapor deposition (CVD) process, for example.

FIG. 6 illustrates in a simplified cross-sectional view, in-line protection structure 100 at a subsequent stage of manufacture in accordance with an embodiment of the present invention. At this stage, a top portion of the conductive layer 502 is removed. A top surface of in-line protection structure 100 is subjected to a chemical mechanical planarization (CMP) process to remove a top portion of the conductive layer 502. A planarized top surface 602 is formed as a result of the CMP process. Contacts 604 and 606, and interconnecting conductive trace 608 remain after the CMP process and form an electrical conduction path from gate 108 to tie 116. Because the electrical conduction path from gate 108 to substrate tie 116 is formed, charge collected on gate 108 during subsequent process steps can be discharged to the substrate 102 through substrate tie 116, preventing charge accumulation on gate 108 and damage to underlying gate oxide 104.

Figure 7:
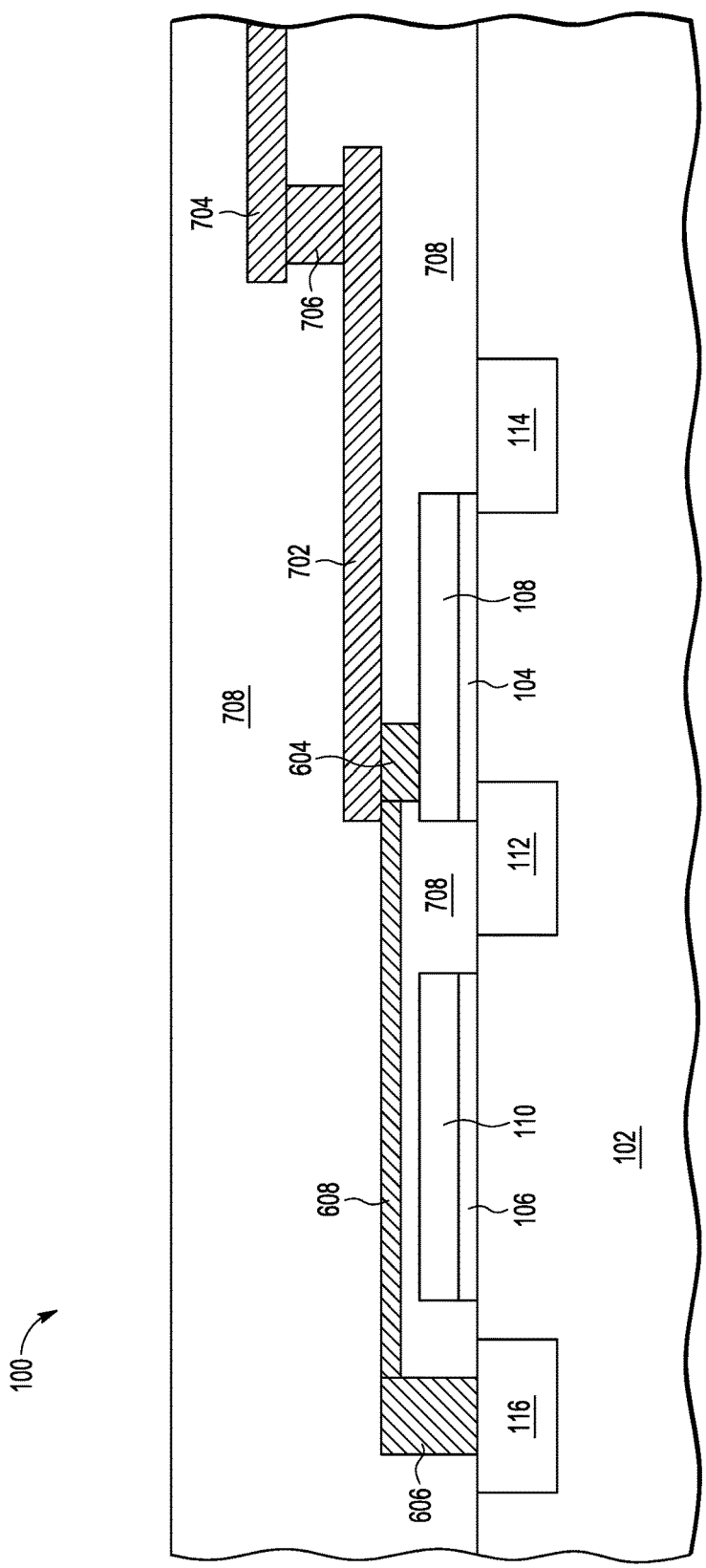

FIG. 7 illustrates in a simplified cross-sectional view, in-line protection structure 100 at a subsequent stage of manufacture in accordance with an embodiment of the present invention. At this stage, a first metal interconnect layer 702 is formed. In this embodiment, first metal interconnect layer 702 is connected to gate 108 by way of contact 604. After forming first metal interconnect layer 702, a second metal interconnect layer 704 is formed. Second metal interconnect layer 704 is connected to first metal interconnect layer 702 by way of via 706. Interconnect layers 702 and 704 provide other discharge paths (not shown) during fabrication of the IC. In this embodiment, first metal interconnect layer 702, second metal interconnect layer 704, and via 706 are formed from a copper material by way of a dual damascene process. Other metal interconnect layers may be subsequently formed and interconnected to higher or lower metal interconnect layers by way of vias. In this embodiment, after second metal interconnect layer 704 is formed, an interlevel dielectric layer 708 is blanket deposited over metal interconnect layer 704 and other exposed surfaces of in-line protection structure 100. Interlevel dielectric layer 708 is formed from a deposited oxide such as TEOS in this embodiment. Other suitable materials and techniques may be used to form interlevel dielectric layer 708.

Figure 8:
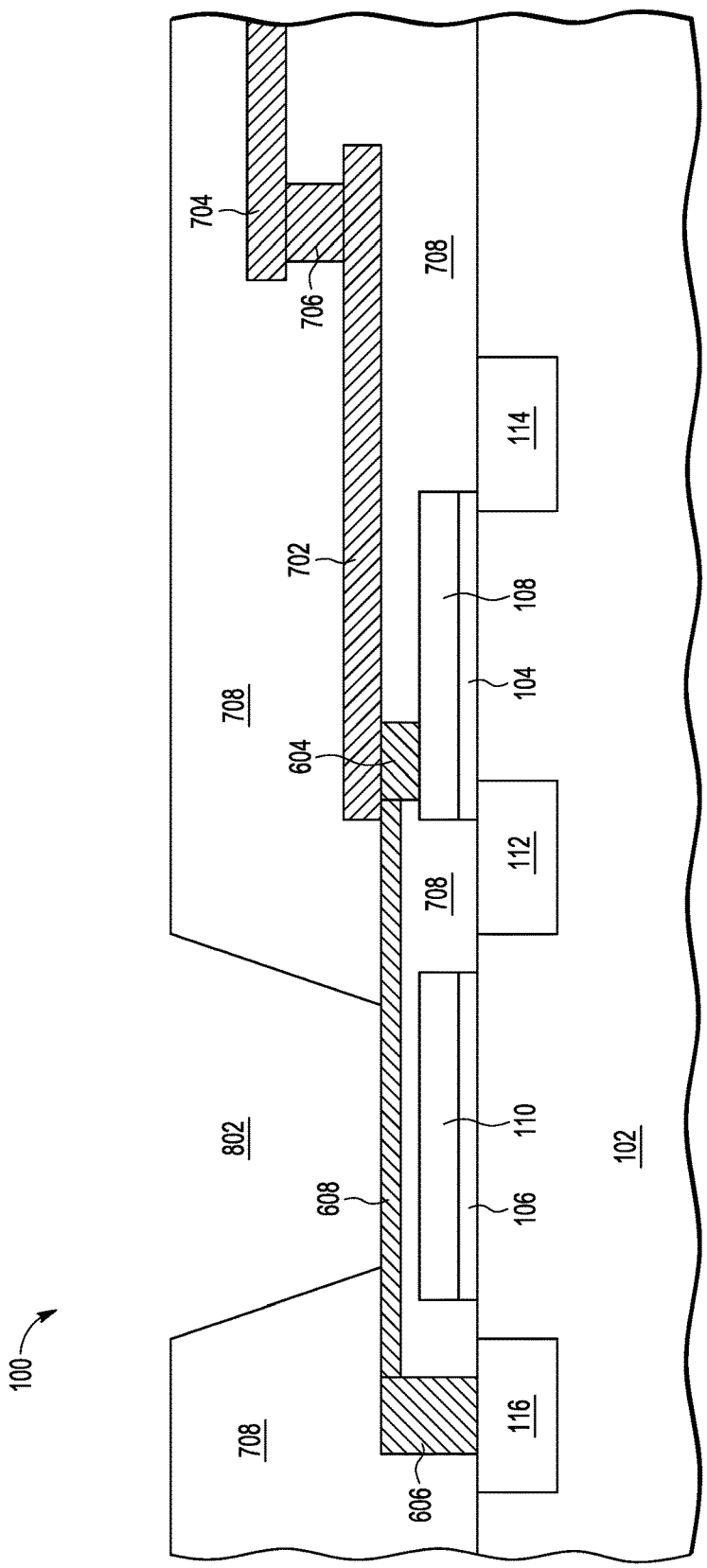

FIG. 8 illustrates in a simplified cross-sectional view, in-line protection structure 100 at a subsequent stage of manufacture in accordance with an embodiment of the present invention. At this stage, an opening 802 is etched in interlevel dielectric layer 708 to expose a portion of conductive trace 608. After forming interlevel dielectric layer 708, opening 802 is formed to expose the portion of conductive trace 608. In this embodiment, the opening 802 is formed using a dry etch process such as a reactive ion etch (RIE), for example.

Other suitable etch techniques may be used to form opening 802. For example, in some embodiments opening 802 may be formed as a pair of openings flanked on the sides of conductive trace 608. The pair of openings may not expose a portion of conductive trace 608 (see FIG. 11).

Figure 9:
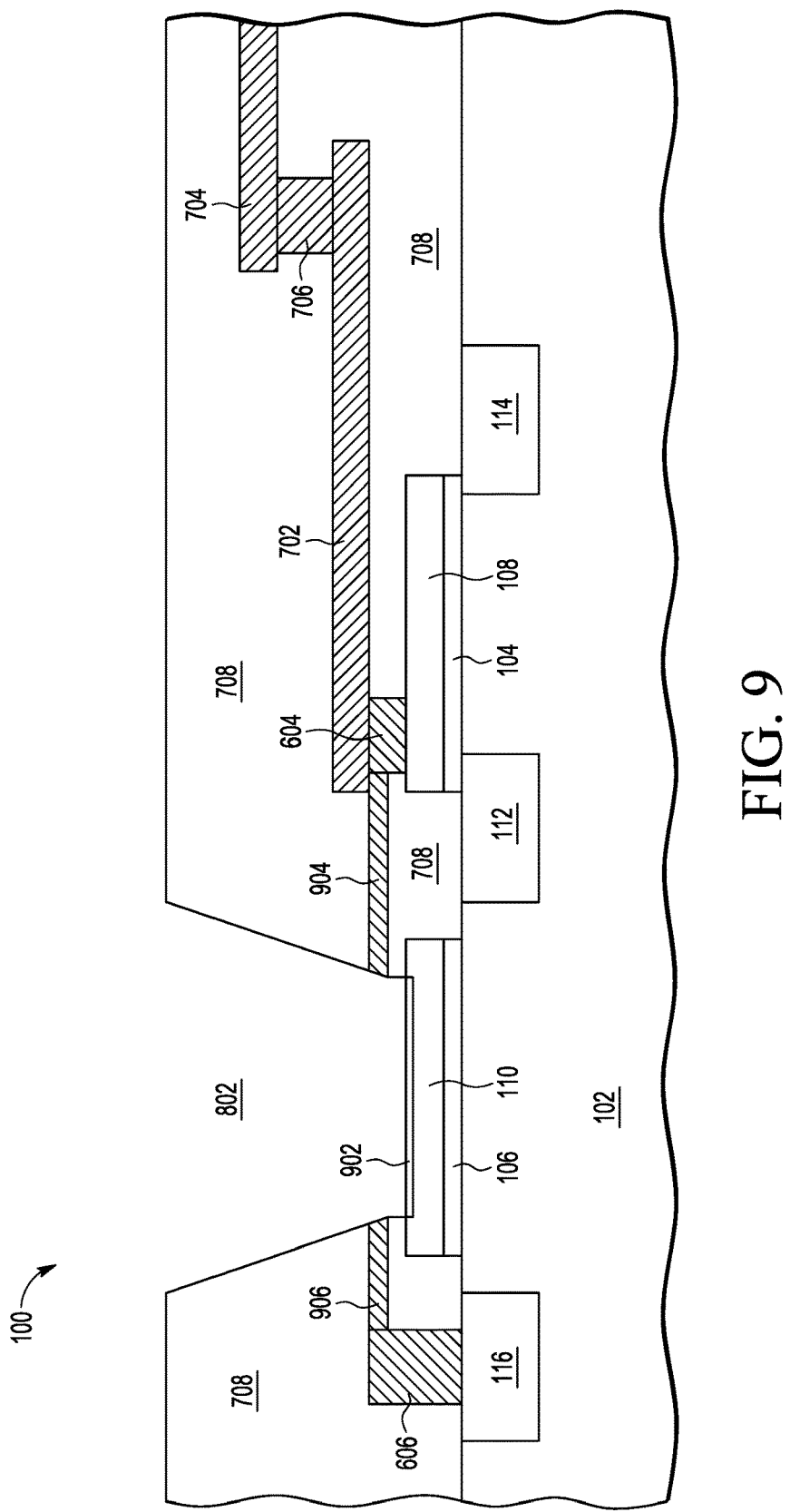

FIG. 9 illustrates in a simplified cross-sectional view, in-line protection structure 100 at a subsequent stage of manufacture in accordance with an embodiment of the present invention. At this stage, the exposed portion of conductive trace 608 is etched to form an electrical open circuit in the conduction path from gate 108 through substrate tie 116. Because gate 108 was subsequently interconnected to other structures while connected to substrate tie 116, the conduction path is no longer needed to prevent gate oxide 104 from damage and therefore, can be disconnected. In this embodiment, the exposed portion of conductive trace 608 is etched by way of a wet etch process to electrically disconnect gate 108 from substrate tie 116. Etch stop 110 allows completion of the wet etch process at a predetermined depth, for example. After the wet etch process, opening 802 extends to a top surface 902 of etch stop 110.

In some embodiments, where opening 802 is formed as a pair of openings flanking conductive trace 608 (see FIG. 11), a wet isotropic etch is used to form an electrical open circuit in the conduction path from gate 108 through substrate tie 116. Etch stop 110 allows completion of the wet etch process at a predetermined depth, for example. After the wet etch process, the pair of openings extend to a top surface 902 of etch stop 110.

Figure 10:
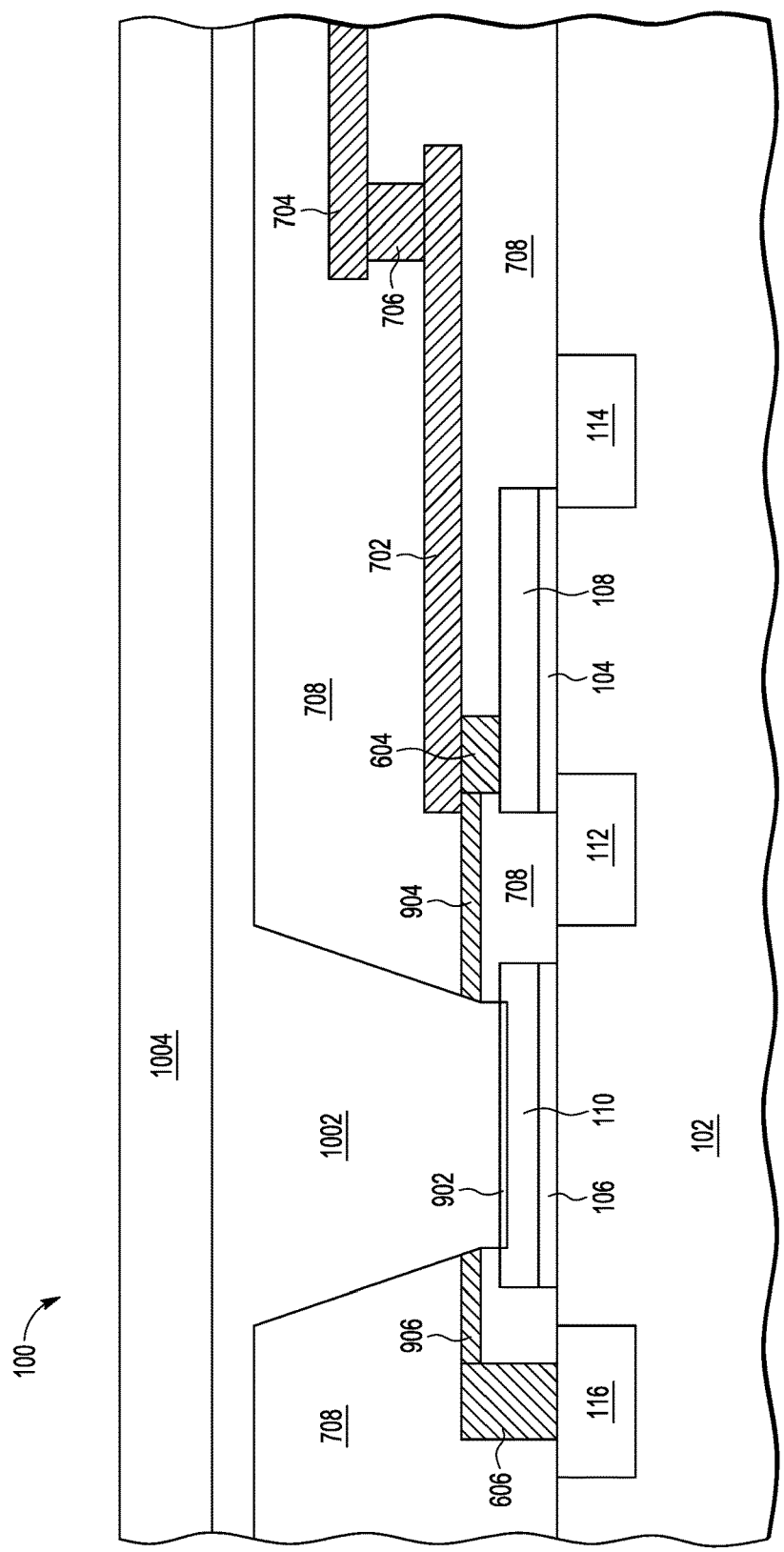

FIG. 10 illustrates in a simplified cross-sectional view, in-line protection structure 100 at a subsequent stage of manufacture in accordance with an embodiment of the present invention. At this stage, a conformal dielectric layer 1002 is blanket deposited to over a top surface of in-line protection structure 100 substantially filling etched opening 802. In this embodiment, a conformal low temperature silicon nitride dielectric material is deposited as conformal dielectric layer 1002 using a plasma enhanced chemical vapor deposition (PECVD) process, for example. After substantially filling opening 802 with conformal dielectric layer 802, a passivation layer 1004 is deposited. Passivation layer 1004 may be formed from any suitable passivation material such as polyimide, silicon oxide, silicon nitride, and the like, for example.

Figure 11:
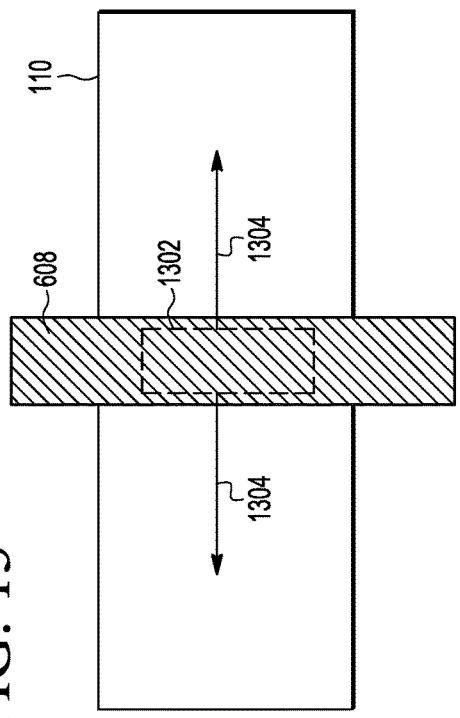
FIG. 11 illustrates, in a simplified plan view, an etch technique in accordance with another embodiment of the present invention.

FIG. 11 illustrates, in a simplified plan view, an etch technique in accordance with another embodiment of the present invention. The plan view depicted in FIG. 11 is a 90-degree rotated view of a portion of the illustration shown in FIG. 8. The illustration of FIG. 11 includes a portion of etch stop 110 and overlaying portion of conductive trace 608 as depicted in FIG. 8. In this embodiment, etch opening locations 1102 and 1104 flank both sides of conductive trace 608 over etch stop 110. Arrows 1106 indicate an etch direction to subsequently form an opening in conductive trace 608.

Figure 12:
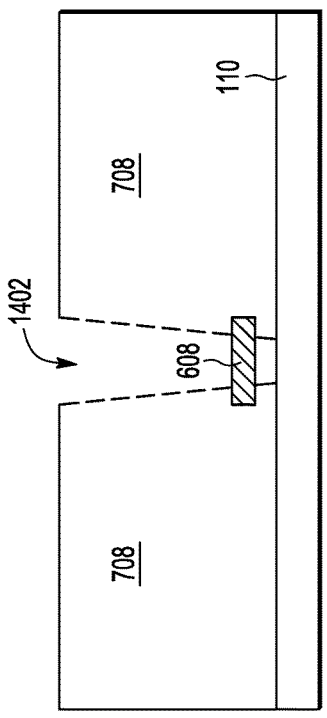
FIG. 12 illustrates, in a simplified cross-sectional view, the etch technique of FIG. 11 in accordance with another embodiment of the present invention.

FIG. 12 illustrates, in a simplified cross-sectional view, the etch technique of FIG. 11 in accordance with another embodiment of the present invention. The cross-sectional view depicted in FIG. 12 corresponds to the plan view depicted in FIG. 11. The illustration of FIG. 12 includes a portion of etch stop 110, overlaying portion of conductive trace 608, and interlevel dielectric 708 as depicted in FIG. 8. In this embodiment, etch openings 1202 flank both sides of conductive trace 608 over etch stop 110.

In the embodiment depicted in FIG. 11 and FIG. 12, etched openings 1202 are formed to flank both sides of conductive trace 608 over etch stop 110. The etched openings 1202 may not expose a portion of conductive trace 608. A subsequent isotropic wet etch is used to etch laterally (indicated by arrows 1106), and form an opening in conductive trace 608. Thus, an electrical open circuit is formed in the conduction path from gate 108 through substrate tie 116. Etch stop 110 allows completion of the wet etch process at a predetermined depth, for example. After the wet etch process, the pair of openings extend to a top surface 902 of etch stop 110 (FIG. 9).

Figure 13:
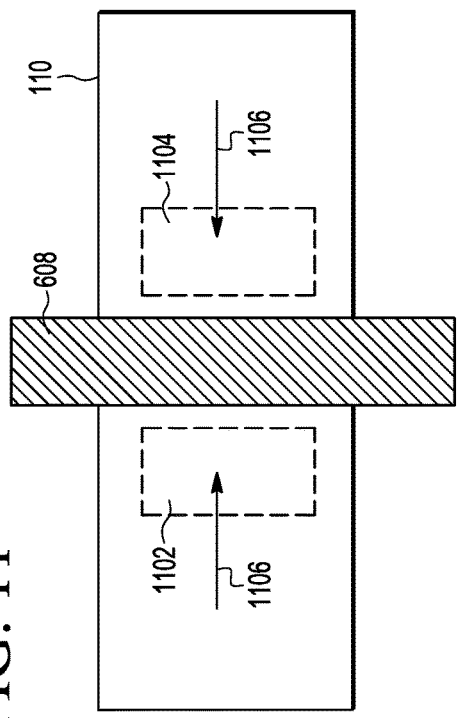
FIG. 13 illustrates, in a simplified plan view, another etch technique in accordance with another embodiment of the present invention.

FIG. 13 illustrates, in a simplified plan view, another etch technique in accordance with another embodiment of the present invention. The plan view depicted in FIG. 13 is a 90-degree rotated view of a portion of the illustration shown in FIG. 8. The illustration of FIG. 13 includes a portion of etch stop 110 and overlaying portion of conductive trace 608 as depicted in FIG. 8. In this embodiment, etch opening location 1302 is positioned over conductive trace 608 and etch stop 110. Arrows 1304 indicate an etch direction to subsequently form an opening in conductive trace 608.

Figure 14:
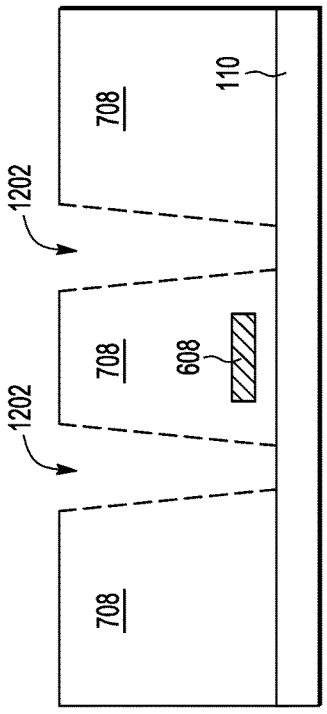
FIG. 14 illustrates, in a simplified cross-sectional view, the etch technique of FIG. 13 in accordance with another embodiment of the present invention.

FIG. 14 illustrates, in a simplified cross-sectional view, the etch technique of FIG. 13 in accordance with another embodiment of the present invention. The cross-sectional view depicted in FIG. 14 corresponds to the plan view depicted in FIG. 13. The illustration of FIG. 14 includes a portion of etch stop 110, overlaying portion of conductive trace 608, and interlevel dielectric 708 (FIG. 8). In this embodiment, etched opening 1402 is formed over conductive trace 608 and etch stop 110.

In the embodiment depicted in FIG. 13 and FIG. 14, etched opening 1402 is formed over conductive trace 608 and exposes a portion of conductive trace 608. A subsequent isotropic wet etch is used to etch laterally (indicated by arrows 1304), and form an opening in conductive trace 608. Thus, an electrical open circuit is formed in the conduction path from gate 108 through substrate tie 116. Etch stop 110 allows completion of the wet etch process at a predetermined depth, for example. After the wet etch process, the etch opening extends to a top surface 902 of etch stop 110 (FIG. 9).

Generally, there is provided, a method including patterning a conductive layer to form a first conductive shape on a first portion of a dielectric layer and a second conductive shape on a second portion of the dielectric layer; forming a conductive trace over at least a portion of the second conductive shape, the conductive trace electrically connecting the first conductive shape to a substrate tie; forming an interconnect layer coupled to the first conductive shape; and etching through the conductive trace over the portion of the second conductive shape to electrically isolate the first conductive shape from the substrate tie. The conductive trace may include a first contact connected to the first conductive shape and a second contact connected to substrate tie, the conductive trace, first contact, and second contact including a same metal material. The conductive layer, first conductive shape, and second conductive shape may include a polysilicon material. The conductive shape may be characterized as transistor gate, and the second conductive shape is characterized as an etch stop. The conductive trace may include tungsten and may be formed using a dual-damascene process. The dielectric layer may include an oxide material. The dielectric layer may include a dielectric material characterized as a high-K dielectric. Forming the interconnect layer may include forming a copper interconnect layer by way of a dual-damascene process. Etching the conductive trace may include a dry etch process followed by a wet etch process.

In another embodiment, there is provided, a method including patterning a conductive layer to form a first conductive shape on a first portion of a dielectric layer and a second conductive shape on a second portion of the dielectric layer; depositing a first metal layer to form an interconnect trace, a first contact, and a second contact, the interconnect trace to form an electrical connection between the first contact and the second contact, the first contact to connect to the first conductive shape and the second contact to connect to a substrate tie region; depositing a second metal layer to form an interconnect coupled to the first conductive shape; and etching through the conductive trace over a portion of the second conductive shape to electrically isolate the first conductive shape from the substrate tie region. Depositing the first metal layer to form the interconnect trace, first contact, and second contact may include depositing a tungsten material by way of a dual-damascene process. The first conductive shape may be characterized as a transistor gate or a capacitor plate, and the second conductive shape may be characterized as an etch stop. The conductive layer may include a polysilicon material. The dielectric layer may include an oxide material and the first portion of the dielectric layer may be characterized as a gate oxide. Depositing the second metal layer may include depositing a copper interconnect layer using a dual-damascene process.

In yet another embodiment, there is provided, a method including forming a dielectric layer on a semiconductor substrate; depositing a polysilicon layer on the dielectric layer; patterning the polysilicon layer to form a first polysilicon region on a first portion of the dielectric layer and a second polysilicon region on a second portion of the dielectric layer; forming a conductive trace comprising an interconnect, a first contact, and a second contact from a same metal material, the first contact coupled to the first polysilicon region and the second contact coupled to the substrate by way of a substrate tie, the interconnect connected between the first and second contacts; forming an interconnect coupled to the first conductive shape; and etching the conductive trace directly over at least a portion of the second polysilicon region to form an open circuit between the first polysilicon region and the substrate tie. The first polysilicon region may be characterized as a transistor gate or a capacitor plate, and the second polysilicon region may be characterized as an etch stop. Forming a conductive trace including an interconnect, a first contact, and a second contact from a same metal material may include depositing a tungsten material by way of a dual-damascene process. Etching the conductive trace may include forming an opening in an interlevel dielectric directly over at least a portion of the second polysilicon region. The method may further include after forming the open circuit between the first polysilicon region and the substrate tie, depositing a conformal dielectric material to substantially fill the opening.

By now it should be appreciated that there has been provided, an integrated circuit (IC) in-line protection structure and method of forming the same. The in-line protection structure prevents excessive charge build up on device features (e.g., transistor gates, capacitor plates, deep trench dielectric isolation) which may cause dielectric (e.g., oxide) damage during manufacture of the IC. A conduction path from such device feature to the substrate of the IC is formed from a same metallization (e.g., tungsten) step. For example, a first contact of the conduction path is connected to a transistor gate and a second contact of the conduction path is connected to the substrate by way of substrate tie. A portion of the conduction path is formed over a dummy structure used as an etch stop, where the dummy structure and transistor gate are formed during a same process step and with same materials (e.g., polysilicon). After other interconnections to circuit features on the IC are coupled to the transistor gate during subsequent stages of manufacture, the conduction path can be opened by way of an etch process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    patterning a conductive layer to form a first conductive shape on a first portion of a dielectric layer and a second conductive shape on a second portion of the dielectric layer, the first conductive shape characterized as transistor gate and the second conductive shape is characterized as an etch stop;
    forming a conductive trace over at least a portion of the second conductive shape, the conductive trace electrically connecting the first conductive shape to a substrate tie;
    forming an interconnect layer coupled to the first conductive shape; and
    etching through the conductive trace over the portion of the second conductive shape to electrically isolate the first conductive shape from the substrate tie.

2. The method of claim 1, wherein the conductive trace comprises a first contact connected to the first conductive shape and a second contact connected to substrate tie, the conductive trace, first contact, and second contact comprising a same metal material.

3. The method of claim 1, wherein the conductive layer, first conductive shape, and second conductive shape comprise a polysilicon material.

4. The method of claim 1, wherein the conductive trace comprises tungsten and is formed using a dual-damascene process.

5. The method of claim 1, wherein the dielectric layer comprises an oxide material.

6. The method of claim 1, wherein the dielectric layer comprises a dielectric material characterized as a high-K dielectric.

7. The method of claim 1, wherein forming the interconnect layer comprises forming a copper interconnect layer by way of a dual-damascene process.

8. The method of claim 1, wherein etching the conductive trace comprises a dry etch process followed by a wet etch process.

9. A method comprising:
    patterning a conductive layer to form a first conductive shape on a first portion of a dielectric layer and a second conductive shape on a second portion of the dielectric layer;
    depositing, by way of a dual-damascene process, a first metal layer comprising a tungsten material to form an interconnect trace, a first contact, and a second contact, the interconnect trace to form an electrical connection between the first contact and the second contact, the first contact to connect to the first conductive shape and the second contact to connect to a substrate tie region;
    depositing a second metal layer to form an interconnect coupled to the first conductive shape; and etching through the conductive trace over a portion of the second conductive shape to electrically isolate the first conductive shape from the substrate tie region.

10. The method of claim 9, wherein the first conductive shape is characterized as a transistor gate or a capacitor plate, and the second conductive shape is characterized as an etch stop.

11. The method of claim 9, wherein the conductive layer comprises a polysilicon material.

12. The method of claim 9, wherein the dielectric layer comprises an oxide material and the first portion of the dielectric layer is characterized as a gate oxide.

13. The method of claim 9, wherein depositing the second metal layer comprises depositing a copper interconnect layer using a dual-damascene process.

14. A method comprising:
forming a dielectric layer on a semiconductor substrate;
depositing a polysilicon layer on the dielectric layer;
patterning the polysilicon layer to form a first polysilicon region on a first portion of the dielectric layer and a second polysilicon region on a second portion of the dielectric layer;
forming a conductive trace comprising an interconnect, a first contact, and a second contact from a same metal material, the first contact coupled to the first polysilicon region and the second contact coupled to the substrate by way of a substrate tie, the interconnect connected between the first and second contacts;
forming an interconnect coupled to the first conductive shape; and
etching the conductive trace directly over at least a portion of the second polysilicon region to form an open circuit between the first polysilicon region and the substrate tie.

15. The method of claim 14, wherein the first polysilicon region is characterized as a transistor gate or a capacitor plate, and the second polysilicon region is characterized as an etch stop.

16. The method of claim 14, wherein forming a conductive trace comprising an interconnect, a first contact, and a second contact from a same metal material comprises depositing a tungsten material by way of a dual-damascene process.

17. The method of claim 14, wherein etching the conductive trace comprises forming an opening in an interlevel dielectric directly over at least a portion of the second polysilicon region.

18. The method of claim 17, further comprising after forming the open circuit between the first polysilicon region and the substrate tie, depositing a conformal dielectric material to substantially fill the opening.

19. A method comprising:
patterning a conductive layer to form a first conductive shape on a first portion of a dielectric layer and a second conductive shape on a second portion of the dielectric layer;
forming, using a dual-damascene process, a conductive trace comprising tungsten over at least a portion of the second conductive shape, the conductive trace electrically connecting the first conductive shape to a substrate tie;
forming an interconnect layer coupled to the first conductive shape; and
etching through the conductive trace over the portion of the second conductive shape to electrically isolate the first conductive shape from the substrate tie.

20. A method comprising:
patterning a conductive layer to form a first conductive shape on a first portion of a dielectric layer and a second conductive shape on a second portion of the dielectric layer, the dielectric layer comprising a dielectric material characterized as a high-K dielectric;
forming a conductive trace over at least a portion of the second conductive shape, the conductive trace electrically connecting the first conductive shape to a substrate tie;
forming an interconnect layer coupled to the first conductive shape; and
etching through the conductive trace over the portion of the second conductive shape to electrically isolate the first conductive shape from the substrate tie.

21. A method comprising:
patterning a conductive layer to form a first conductive shape on a first portion of a dielectric layer and a second conductive shape on a second portion of the dielectric layer;
forming a conductive trace over at least a portion of the second conductive shape, the conductive trace electrically connecting the first conductive shape to a substrate tie;
forming, by way of a dual-damascene process, a copper interconnect layer coupled to the first conductive shape; and
etching through the conductive trace over the portion of the second conductive shape to electrically isolate the first conductive shape from the substrate tie.

22. A method comprising:
patterning a conductive layer to form a first conductive shape on a first portion of a dielectric layer and a second conductive shape on a second portion of the dielectric layer;
forming a conductive trace over at least a portion of the second conductive shape, the conductive trace electrically connecting the first conductive shape to a substrate tie;
forming an interconnect layer coupled to the first conductive shape; and
etching through the conductive trace over the portion of the second conductive shape to electrically isolate the first conductive shape from the substrate tie, the etching comprising a dry etch process followed by a wet etch process.

23. A method comprising:
patterning a conductive layer to form a first conductive shape on a first portion of a dielectric layer and a second conductive shape on a second portion of the dielectric layer, the first conductive shape characterized as a transistor gate or a capacitor plate and the second conductive shape characterized as an etch stop;
depositing a first metal layer to form an interconnect trace, a first contact, and a second contact, the interconnect trace to form an electrical connection between the first contact and the second contact, the first contact to connect to the first conductive shape and the second contact to connect to a substrate tie region;
depositing a second metal layer to form an interconnect coupled to the first conductive shape; and
etching through the conductive trace over a portion of the second conductive shape to electrically isolate the first conductive shape from the substrate tie region.

24. A method comprising:
- patterning a conductive layer to form a first conductive shape on a first portion of a dielectric layer and a second conductive shape on a second portion of the dielectric layer, the dielectric layer comprising an oxide material and the first portion of the dielectric layer characterized as a gate oxide;
- depositing a first metal layer to form an interconnect trace, a first contact, and a second contact, the interconnect trace to form an electrical connection between the first contact and the second contact, the first contact to connect to the first conductive shape and the second contact to connect to a substrate tie region;
- depositing a second metal layer to form an interconnect coupled to the first conductive shape; and
- etching through the conductive trace over a portion of the second conductive shape to electrically isolate the first conductive shape from the substrate tie region.

25. A method comprising:
- patterning a conductive layer to form a first conductive shape on a first portion of a dielectric layer and a second conductive shape on a second portion of the dielectric layer;
- depositing a first metal layer to form an interconnect trace, a first contact, and a second contact, the interconnect trace to form an electrical connection between the first contact and the second contact, the first contact to connect to the first conductive shape and the second contact to connect to a substrate tie region;
- depositing a second metal layer to form an interconnect coupled to the first conductive shape, the depositing the second metal layer comprising depositing a copper interconnect layer using a dual-damascene process; and
- etching through the conductive trace over a portion of the second conductive shape to electrically isolate the first conductive shape from the substrate tie region.

* * * * *